United States Patent [19]
Banba et al.

[11] Patent Number: 6,133,535
[45] Date of Patent: Oct. 17, 2000

[54] ELECTRONIC COMPONENT HAVING CALCINED ELECTRODE

[75] Inventors: Shinichiro Banba, Komatsu; Hiroji Tani, Nagaokakyo, both of Japan

[73] Assignee: Murata Manufacturing Co., Ltd., Japan

[21] Appl. No.: 08/895,223

[22] Filed: Jul. 16, 1997

[30] Foreign Application Priority Data

Jul. 16, 1996 [JP] Japan .................................. 8-186346
Jun. 25, 1997 [JP] Japan .................................. 9-168976

[51] Int. Cl.⁷ .................................................. H01R 9/09
[52] U.S. Cl. ......................... 174/257; 174/264; 174/266
[58] Field of Search .................................. 174/263, 264, 174/265, 266, 256, 257

[56] References Cited

U.S. PATENT DOCUMENTS 5,340,947 8/1994 Credle et al. ............................. 174/262
5,487,218 1/1996 Bhatt et al. ............................... 29/852
5,569,958 10/1996 Bloom ...................................... 257/698

*Primary Examiner*—Kristine Kincaid
*Assistant Examiner*—Kamand Cuneo
*Attorney, Agent, or Firm*—Ostrolenk, Faber, Gerb & Soffen, LLP

[57] ABSTRACT

The invention provides an electronic component includes a substrate, and a calcined electrode provided on the substrate, characterized in that the electrode includes a base metal in addition to a noble metal, and the base metal undergoes oxidative expansion on calcination so that the dimensional retention of the baked electrode on calcination is not lower than about 0.6. Dimensional retention means the ratio of the electrode thickness after calcination to the electrode dry thickness before calcination. The baked electrode suffers from neither discontinuity nor separation from the inner wall of through-holes due to shrinkage on calcination.

22 Claims, 3 Drawing Sheets

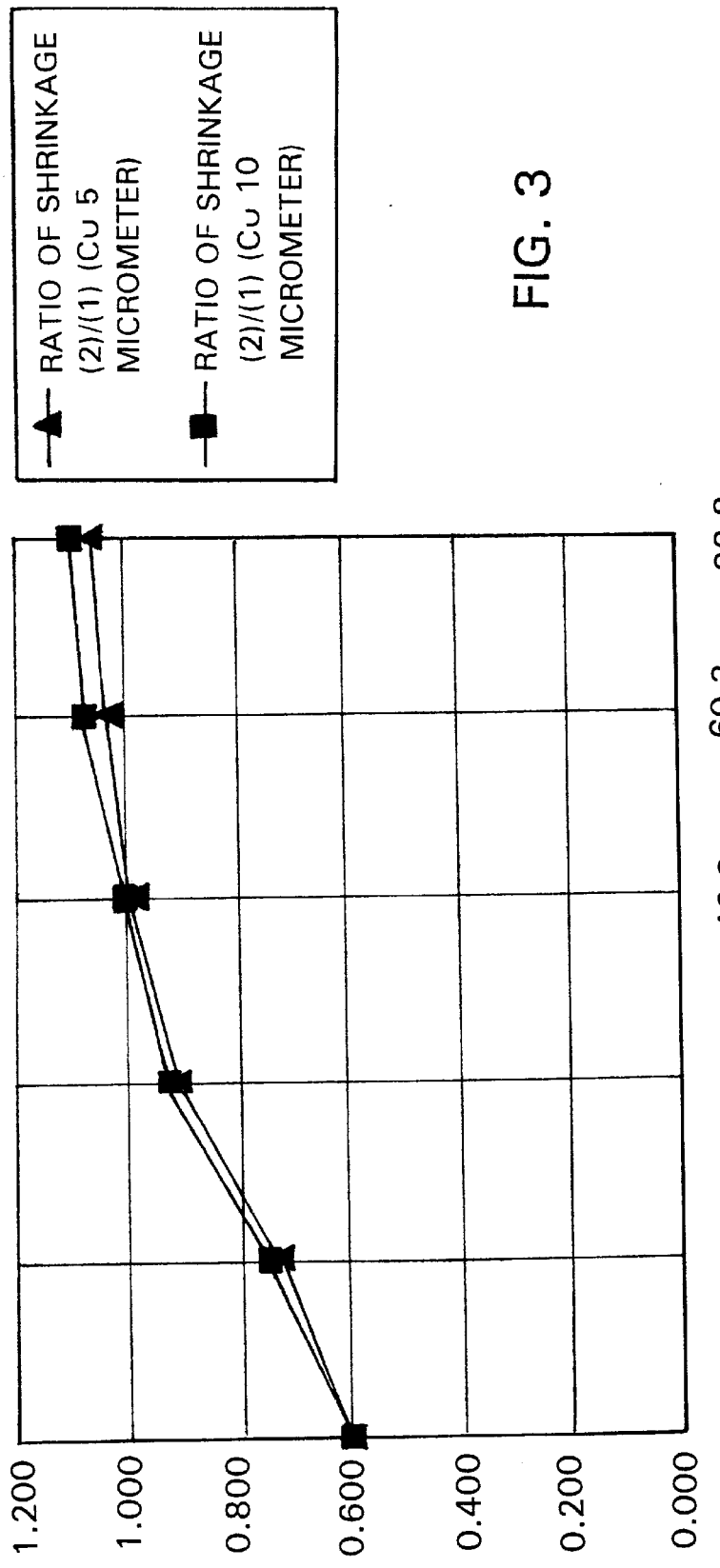

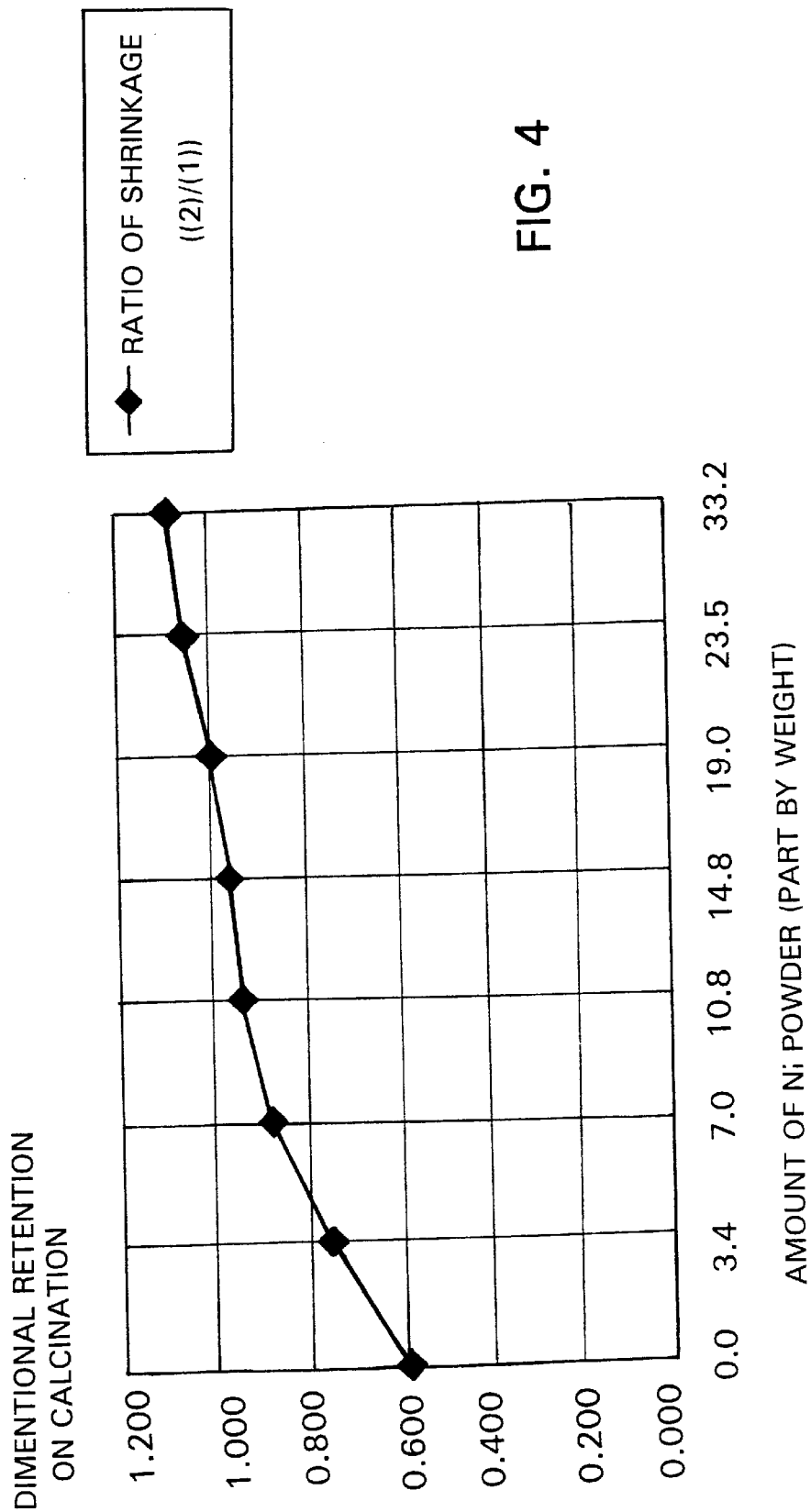

ELECTRONIC COMPONENT HAVING CALCINED ELECTRODE

BACKGROUND OF THE INVENTION

1. Field of the Invention

This invention relates to an electronic component comprising a substrate and a baked electrode provided on the substrate. The baked electrode is used for a through-hole or a via-hole, for example.

2. Description of Related Art

As shown in the cross sectional view of FIG. 1(a), electrical connection through-holes of a ceramic substrate 1 has been achieved by applying an electrically conductive composition comprising a conductive material, such as Ag—Pd or Ag—Pt, to the through-hole 2 having a diameter of 0.3 to 0.5 mm, which is made by means of a mold or a laser beam, by screen printing, followed by calcination to form a thick-film conductor 3 on the inner wall of the through-hole 2.

With the recent tendency to size reduction and density increase of electronic equipment, the diameter of through-holes has become as small as about 0.1 mm, and accordingly, the above-described electrical connection is now being replaced with filling the through-hole 2 with a conductive composition as shown in FIG. 1(b).

However, when a conventional conductive composition used in electronic components is put into through-holes of about 0.1 mm in diameter and calcined, the resulting conductor tends to suffer from a discontinuity as shown in FIG. 2(a) or separation from the inner wall as shown in FIG. 2(b) due to shrinkage on calcination, resulting in poor electrical reliability of the through-holes.

SUMMARY OF THE INVENTION

An object of the present invention is to prevent structural defects of electrodes, such as a discontinuity or separation of electrodes, and to provide an electronic component with improved electrical reliability.

The invention provides an electronic component of the above mentioned kind, which is characterized in that the baked electrode comprises a base metal in addition to a noble metal, and the base metal undergoes oxidative expansion on calcination to thereby achieve a dimensional retention of the baked electrode on calcination of not lower than about 0.6. Dimensional retention means the ratio of the electrode thickness after calcination to the dry thickness before calcination.

The term "dry thickness" as used herein denotes the thickness of a layer (electrode) formed by applying a conductive composition on the substrate, e.g., through a patterned screen, and drying the composition at 150° C. for 10 minutes. The term "thickness after calcination" as used herein denotes the thickness of the dried layer (electrode) after calcination under prescribed conditions.

In the above electronic component, the dimensional retention of the baked electrode is preferably not lower than about 0.85.

In the above electronic component, the noble metal may comprise silver or gold.

In the above electronic component, the base metal comprises copper, nickel, cobalt, tungsten or manganese.

In the above electronic component, the baked electrode may be for use in a through-hole or a via-hole.

In the above electronic component, an anti-oxidation finished base metal can be employed instead of the noble metal.

The invention further provides a manufacturing method for the above described electronic components, comprising the steps of 1) preparing a mixed conductive powder by mixing a noble metal powder and a base metal powder, and 2) calcining the mixed conductive powder to obtain the baked electrode.

According to the present invention, there is provided an electronic component which is free from structural defects of the electrodes, such as a discontinuity and separation of the electrodes, and maintains electrical connection even after calcination thereby securing improved electrical reliability.

When a noble metal powder alone is used as a conductive powder forming an electrode, the electrode obtained after calcination is thinner than in its green state before calcination due to calcination shrinkage. This volume shrinkage causes the discontinuity or separation of the electrode. A base metal powder added to the noble metal powder undergoes oxidation on calcination (baking), resulting in a volume expansion called oxidative expansion. That is, the oxidative expansion of the base metal powder compensates for the calcination shrinkage of the noble metal powder so that the reduction in volume after baking can be prevented. It is also possible to increase the volume after baking over that before baking. Accordingly, the present invention makes it possible to sufficiently maintain the electrical connection after calcination.

For this reason, the dimensional retention on calcination (hereinafter simply referred to as a dimensional retention), expressed in terms of the ratio of the thickness after calcination to the dry thickness before calcination, of the mixed conductive powder used in the present invention is higher than that of a noble metal powder alone.

It is not always necessary to add a base metal powder to such an extent that the dimensional retention of the mixed powder is 1.0 or more. For some uses, the loss of volume by shrinkage of a noble metal powder does not need to be occupied completely by a base metal powder. In other words, addition of a base metal powder to such an extent as to prevent occurrence of electrode discontinuity or separation suffices for the object of the present invention.

The present invention specifies that the dimensional retention of the mixed conductive powder is at least about 0.6 and is greater than the dimensional retention of a noble metal powder alone. The inventors have confirmed by experiments that the object of the present invention is accomplished thereby. A preferred dimensional retention is about 0.85 or more, in which case an improved yield of electrical connection of through-holes can be secured.

Since the base metal powder of the mixed conductive powder should undergo oxidative expansion on calcination, calcination is preferably carried out in a non-reducing atmosphere, e.g., air, which is another advantage of the present invention.

Examples of the noble metal which can be used in the present invention include silver and gold. Silver is preferred from the standpoint of low resistance of the resulting conductor, ease of calcination, and the material cost. It is possible to substitute a powder of anti-oxidation finished copper, nickel, etc. for the noble metal powder because these powders, while not a noble metal, function similarly to a noble metal powder. It is also possible to use aluminum, while not a noble metal.

Examples of the base metals which can be used in the present invention include copper, nickel, cobalt, tungsten, and manganese, with copper and nickel being preferred.

Copper is preferred for its ease of oxidation, its high melting point, lack of reactivity with noble metal powder, and the material cost. Nickel is preferred for the same reasons. Both copper and nickel can be used.

If desired, the conductive composition may contain a glass frit. Addition of glass frit is advantageous where electrodes and substrate are not calcined simultaneously. Where electrodes and substrate are formed by simultaneous calcination, the powder undergoes a chemical reaction with the material of the substrate to form a chemical bond so that addition of glass frits is not always necessary. Otherwise, glass bonding may be required for adhesion to the substrate. Therefore, in such cases, it is recommended to use glass frits having satisfactory adhesion strength.

Examples of useful glass frits include lead borosilicate-based glass, zinc borosilicate-based glass, bismuth borosilicate-based glass, and barium borosilicate-based glass.

The conductive composition may further contain platinum powder or palladium powder for prevention of migration of the electrode material.

Because of the above-mentioned characteristics, the baked electrodes according to the present invention are preferably used as a conductor filling through-holes or via-holes of a substrate for an electronic component. Accordingly, preferred applications of the electronic component of the present invention are multilayer ceramic substrates and hybrid IC.

According to the present invention, there is provided an electronic component which is free from structural defects of the electrodes, such as a discontinuity and separation of the electrodes, and maintains electrical connection even after calcination thereby securing improved electrical reliability.

The present invention will now be illustrated in greater detail with reference to the following embodiments, but it should be understood that the present invention is not construed as being limited thereto.

BRIEF DESCRIPTION OF THE DRAWINGS

FIG. 3 is a graph showing the relationship between Cu powder content vs. ratio of thickness after calcination/dry thickness.

FIG. 4 is a graph showing the relationship between Ni powder content vs. ratio of thickness after calcination/dry thickness.

PREFERRED EMBODIMENTS OF THE INVENTION

EXAMPLE 1

Figure 1A:
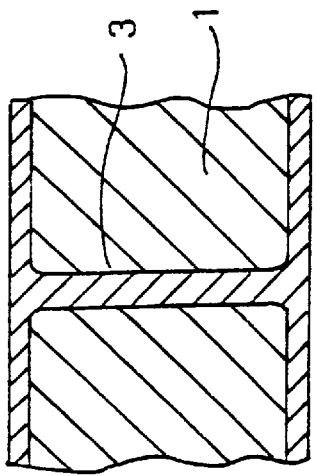
FIGS. 1a and 1b show cross sections of a through-hole of a ceramic substrate.
Figure 1B:
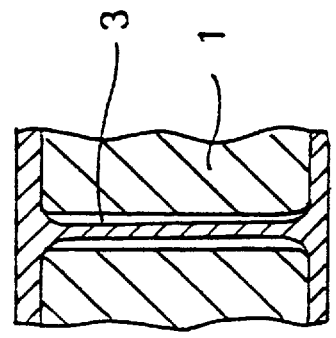
Figure 2A:
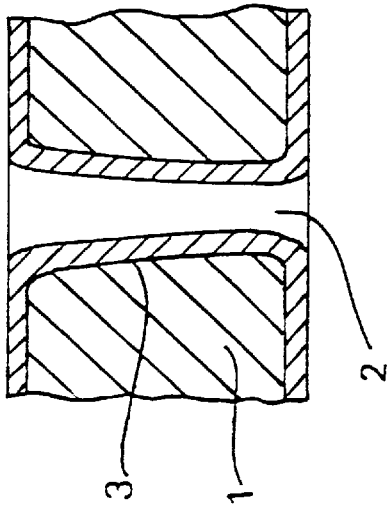
FIGS. 2a and 2b show cross sections of a defective through-hole of a ceramic substrate.
Figure 2B:
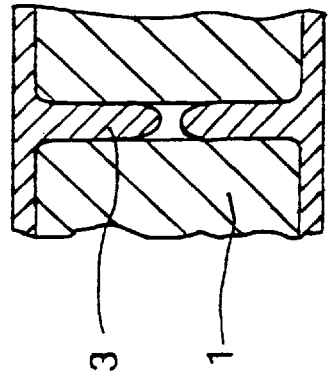

Silver powder having an average particle size of 3 micrometer, platinum powder, and copper powder having an average particle size of either 5 micrometer or 10 micrometer were prepared as the material of a conductive composition. $Pb_3O_4$, $SiO_2$, $H_3BO_3$, and ZnO were mixed, melted at a high temperature, and quenched to obtain a glass, which was then ground to prepare a glass frit having the composition of PbO—$SiO_2$—$B_2O_3$—ZnO.

These materials were mixed at the ratio shown in Table 1 below, and the mixture was kneaded together with an acrylic resin dissolved in α-terpineol as an organic vehicle to prepare a conductive composition. An ethyl cellulose resin, alkyd resin, etc., dissolved in a high-melting solvent may also be used as an organic vehicle.

The resulting conductive composition was applied to a previously prepared 0.63 mm thick aluminum substrate having through-holes of 0.1 mm in diameter to coat the surface of the substrate and to fill the through-holes with the conductive composition. After drying, the aluminum substrate with the conductive composition was calcined at 850° C. in air for 60 minutes.

The thickness of the coating layer on the substrate was measured after drying and after calcination to obtain the ratio of shrinkage on calcination in terms of the ratio of the thickness after calcination to the dry thickness. The sheet resistivity of the conductor formed in the through-hole was measured.

Table 1 below shows the dry thickness (1) (micrometer), the thickness after calcination (2) (micrometer), the dimensional retention ((2)/(1)), and the sheet resistivity (m$\Omega$/□) for each average particle size of Cu powder. The sheet resistivity (m$\Omega$/□) was calculated from equation: R=RS× L/W (RS: sheet resistivity; L: length of resistor(conductor); W: width of resistor(conductor)).

The results of Table 1 were plotted in FIG. 3 to show the relationship between the amount of Cu powder and the shrinkage taking the amount of Cu powder as a parameter.

TABLE 1

| Sample No. | Average particle diameter of Ag Powder | Amount of Ag Powder wt % | Amount of Ag Powder parts | Average Particle Diameter of Cu Powder | Amount of Cu Powder wt % | Amount of Cu Powder Parts | Amount of Glass Frit wt % | Amount of Glass Frit Parts | Amount of Pt Powder wt % | Amount of Pt Powder Parts | Amount of Organic vehicle wt % | Amount of Organic vehicle Parts | Dry Thickness (1) (micrometer) | Thickness After Calcination (2) (micrometer) | Dimensional retention ((2)/(1)) | Sheet Resistivity (m$\Omega$/□) |
|---|---|---|---|---|---|---|---|---|---|---|---|---|---|---|---|---|
| 1 | 3 | 71.0 | 100.0 | 5 | 0.0 | 0.0 | 9.5 | 13.3 | 0 | 0 | 19.5 | 27.4 | 21.4 | 12.6 | 0.590 | 2.5 |
| 2 | 3 | 64.0 | 100.0 | 5 | 10.0 | 15.6 | 8.5 | 13.3 | 0 | 0 | 17.5 | 27.4 | 24.5 | 17.6 | 0.720 | 2.7 |
| 3 | 3 | 56.8 | 100.0 | 5 | 20.0 | 35.2 | 7.6 | 13.3 | 0 | 0 | 15.6 | 27.4 | 22.0 | 19.8 | 0.900 | 3.1 |
| 4 | 3 | 53.3 | 100.0 | 5 | 25.0 | 46.9 | 7.1 | 13.3 | 0 | 0 | 14.6 | 27.4 | 22.5 | 22.1 | 0.980 | 3.7 |
| 5 | 3 | 49.8 | 100.0 | 5 | 30.0 | 60.3 | 6.6 | 13.3 | 0 | 0 | 13.6 | 27.4 | 22.3 | 23.0 | 1.030 | 4.5 |
| 6 | 3 | 42.6 | 100.0 | 5 | 40.0 | 93.8 | 5.7 | 13.3 | 0 | 0 | 11.7 | 27.4 | 23.1 | 24.5 | 1.060 | 6.5 |
| 7 | 3 | 71.0 | 100.0 | 10 | 0.0 | 0.0 | 9.5 | 13.3 | 0 | 0 | 19.5 | 27.4 | 25.1 | 14.8 | 0.590 | 2.4 |
| 8 | 3 | 64.0 | 100.0 | 10 | 10.0 | 15.6 | 8.5 | 13.3 | 0 | 0 | 17.5 | 27.4 | 24.3 | 18.0 | 0.740 | 3.1 |
| 9 | 3 | 56.8 | 100.0 | 10 | 20.0 | 35.2 | 7.6 | 13.3 | 0 | 0 | 15.6 | 27.4 | 22.9 | 21.1 | 0.920 | 4.1 |
| 10 | 3 | 53.3 | 100.0 | 10 | 25.0 | 46.9 | 7.1 | 13.3 | 0 | 0 | 14.6 | 27.4 | 23.1 | 23.1 | 1.000 | 4.9 |

TABLE 1-continued

| Sample No. | Average particle diameter of Ag Powder (micrometer) | Amount of Ag Powder wt % | Amount of Ag Powder parts | Average Particle Diameter of Cu Powder (micrometer) | Amount of Cu Powder wt % | Amount of Cu Powder Parts | Amount of Glass Frit wt % | Amount of Glass Frit Parts | Amount of Pt Powder wt % | Amount of Pt Powder Parts | Amount of Organic vehicle wt % | Amount of Organic vehicle Parts | Dry Thickness (1) (micrometer) | Thickness After Calcination (2) (micrometer) | Dimensional retention ((2)/(1)) | Sheet Resistivity (mΩ/□) |
|---|---|---|---|---|---|---|---|---|---|---|---|---|---|---|---|---|
| 11 | 3 | 49.8 | 100.0 | 10 | 30.0 | 60.3 | 6.6 | 13.3 | 0 | 0 | 13.6 | 27.4 | 23.0 | 24.6 | 1.070 | 5.6 |
| 12 | 3 | 42.6 | 100.0 | 10 | 40.0 | 93.8 | 5.7 | 13.3 | 0 | 0 | 11.7 | 27.4 | 22.7 | 25.0 | 1.100 | 7.3 |
| 13 | 3 | 70.4 | 100.0 | 5 | 0.0 | 0.0 | 9.5 | 13.4 | 0.6 | 0.9 | 19.5 | 27.7 | — | — | — | — |
| 14 | 3 | 63.4 | 100.0 | 5 | 10.0 | 15.8 | 8.5 | 13.4 | 0.6 | 0.9 | 17.5 | 27.7 | — | — | — | — |
| 15 | 3 | 56.3 | 100.0 | 5 | 20.0 | 35.5 | 7.6 | 13.4 | 0.5 | 0.9 | 15.6 | 27.7 | — | — | — | — |
| 16 | 3 | 52.8 | 100.0 | 5 | 25.0 | 47.3 | 7.1 | 13.4 | 0.5 | 0.9 | 14.6 | 27.7 | — | — | — | — |
| 17 | 3 | 49.3 | 100.0 | 5 | 30.0 | 60.9 | 6.6 | 13.4 | 0.5 | 0.9 | 13.6 | 27.7 | — | — | — | — |
| 18 | 3 | 42.2 | 100.0 | 5 | 40.0 | 94.7 | 5.7 | 13.4 | 0.4 | 0.9 | 11.7 | 27.7 | — | — | — | — |
| 19 | 3 | 70.4 | 100.0 | 10 | 0.0 | 0.0 | 9.5 | 13.4 | 0.6 | 0.9 | 19.5 | 27.7 | — | — | — | — |
| 20 | 3 | 63.4 | 100.0 | 10 | 10.0 | 15.8 | 8.5 | 13.4 | 0.6 | 0.9 | 17.5 | 27.7 | — | — | — | — |
| 21 | 3 | 56.3 | 100.0 | 10 | 20.0 | 35.5 | 7.6 | 13.4 | 0.5 | 0.9 | 15.6 | 27.7 | — | — | — | — |
| 22 | 3 | 52.8 | 100.0 | 10 | 25.0 | 47.3 | 7.1 | 13.4 | 0.5 | 0.9 | 14.6 | 27.7 | — | — | — | — |
| 23 | 3 | 49.3 | 100.0 | 10 | 30.0 | 60.9 | 6.6 | 13.4 | 0.5 | 0.9 | 13.6 | 27.7 | — | — | — | — |
| 24 | 3 | 42.2 | 100.0 | 10 | 40.0 | 94.7 | 5.7 | 13.4 | 0.4 | 0.9 | 11.7 | 27.7 | — | — | — | — |

EXAMPLE 2

Silver powder having an average particle size of 3 micrometer, platinum powder, and nickel powder having an average particle size of 0.5 micrometer were prepared as the material of a conductive composition. $Pb_3O_4$, $SiO_2$, $H_3BO_3$, and ZnO were mixed, melted at a high temperature, and quenched to obtain glass, which was then ground to prepare a glass frit having a composition of $PbO$—$SiO_2$—$B_2O_3$—$ZnO$.

These materials were mixed at the ratio shown in Table 2 below, and the mixture was kneaded together with an acrylic resin dissolved in α-terpineol as an organic vehicle to prepare a conductive composition.

The resulting conductive composition was applied to a previously prepared 0.63 mm thick aluminum substrate having through-holes of 0.1 mm in diameter to coat the surface of the substrate and to fill the through-holes with the conductive composition. After drying, the aluminum substrate was calcined at 850° C. in air for 60 minutes.

The thickness of the coating layer on the substrate was measured after drying and after calcination to obtain the ratio of shrinkage on calcination in terms of a ratio of the thickness after calcination to the dry thickness. The sheet resistivity of the conductor formed in the through-hole was measured.

Table 2 below shows the dry thickness (1) (micrometer), the thickness after calcination (2) (micrometer), the ratio of shrinkage ((2)/(1)), and the sheet resistivity (mΩ/□). The sheet resistivity (mΩ/□) was calculated from equation: R=RS×L/W (RS: sheet resistivity; L: length of a resistor (conductor); W: width of a resistor(conductor)).

The results in Table 2 were plotted in FIG. 4 to show the relationship between the amount of Ni powder and the dimensional retention.

TABLE 2

| Sample No. | Average Particle Diameter of Ag Powder (micrometer) | Amount of Ag Powder wt % | Amount of Ag Powder Part by weight | Average Particle Diameter of Ni Powder (micrometer) | Amount of Ni Powder wt % | Amount of Ni Powder Part by weight | Amount of Glass Frit wt % | Amount of Glass Frit Part by weight | Amount of Pt Powder wt % | Amount of Pt Powder Part by weight | Amount of Organic vehicle wt % | Amount of Organic vehicle Part by weight | Dry Thickness (1) (micrometer) | Thickness after Calcination (2) (micrometer) | Dimensional Retention ((2)/(1)) | Sheet Resistivity (mΩ/□) |
|---|---|---|---|---|---|---|---|---|---|---|---|---|---|---|---|---|
| 1 | 3 | 75.2 | 100.0 | 0.5 | 0.0 | 0.0 | 8.1 | 10.8 | 0 | 0 | 16.7 | 22.2 | 22.9 | 13.4 | 0.585 | 1.4 |
| 2 | 3 | 73.3 | 100.0 | 0.5 | 2.5 | 3.4 | 7.9 | 10.8 | 0 | 0 | 16.3 | 22.2 | 24.8 | 18.5 | 0.746 | 1.9 |
| 3 | 3 | 71.4 | 100.0 | 0.5 | 5.0 | 7.0 | 7.7 | 10.8 | 0 | 0 | 15.9 | 22.2 | 22.3 | 19.6 | 0.879 | 2.4 |
| 4 | 3 | 69.6 | 100.0 | 0.5 | 7.5 | 10.8 | 7.5 | 10.8 | 0 | 0 | 15.4 | 22.2 | 25.0 | 23.3 | 0.932 | 2.6 |
| 5 | 3 | 67.7 | 100.0 | 0.5 | 10.0 | 14.8 | 7.3 | 10.8 | 0 | 0 | 15.0 | 22.2 | 25.1 | 24.2 | 0.964 | 3.6 |
| 6 | 3 | 65.8 | 100.0 | 0.5 | 12.5 | 19.0 | 7.1 | 10.8 | 0 | 0 | 14.6 | 22.2 | 25.4 | 25.2 | 0.992 | 3.7 |
| 7 | 3 | 63.9 | 100.0 | 0.5 | 15.0 | 23.5 | 6.9 | 10.8 | 0 | 0 | 14.2 | 22.2 | 23.2 | 24.6 | 1.060 | 3.9 |
| 8 | 3 | 60.2 | 100.0 | 0.5 | 20.0 | 33.2 | 6.5 | 10.8 | 0 | 0 | 13.3 | 22.2 | 21.8 | 23.7 | 1.090 | 4.1 |
| 9 | 3 | 74.6 | 100.0 | 0.5 | 0.0 | 0.0 | 8.1 | 10.9 | 0.6 | 0.8 | 16.7 | 22.4 | — | — | — | — |
| 10 | 3 | 72.8 | 100.0 | 0.5 | 2.5 | 3.4 | 7.9 | 10.9 | 0.5 | 0.8 | 16.3 | 22.4 | — | — | — | — |
| 11 | 3 | 70.9 | 100.0 | 0.5 | 5.0 | 7.1 | 7.7 | 10.9 | 0.5 | 0.8 | 15.9 | 22.4 | — | — | — | — |
| 12 | 3 | 69.0 | 100.0 | 0.5 | 7.5 | 10.9 | 7.5 | 10.9 | 0.5 | 0.8 | 15.5 | 22.4 | — | — | — | — |
| 13 | 3 | 67.2 | 100.0 | 0.5 | 10.0 | 14.9 | 7.3 | 10.9 | 0.5 | 0.8 | 15.0 | 22.4 | — | — | — | — |
| 14 | 3 | 65.3 | 100.0 | 0.5 | 12.5 | 19.1 | 7.1 | 10.9 | 0.5 | 0.8 | 14.6 | 22.4 | — | — | — | — |
| 15 | 3 | 63.4 | 100.0 | 0.5 | 15.0 | 23.6 | 6.9 | 10.9 | 0.5 | 0.8 | 14.2 | 22.4 | — | — | — | — |
| 16 | 3 | 59.7 | 100.0 | 0.5 | 20.0 | 33.2 | 6.5 | 10.9 | 0.4 | 0.8 | 13.4 | 22.4 | — | — | — | — |

What is claimed is:

1. An electronic component comprising a substrate and a calcined electrode on the substrate, characterized in that the calcined electrode has been subjected to calcination and consists essentially of a combination of calcined base metal and another metal selected from the group consisting of noble metal, anti-oxidation finished base metal and Al, wherein the base metal undergoes oxidative expansion on calcination such that the dimensional retention of the calcined electrode on calcination is not lower than about 0.6, and wherein the dimensional retention is the ratio of the electrode thickness after calcination to the dry thickness before calcination.

2. An electronic component according to claim 1, characterized in that the dimensional retention of the calcined electrode is not lower than about 0.85.

3. An electronic component according to claim 1, characterized in that the electrode subjected to calcination contains glass frit.

4. An electronic component according to claim 1, wherein the member of the group is noble metal.

5. An electronic component according to claim 4, characterized in that the dimensional retention of the calcined electrode is not lower than about 0.85.

6. An electronic component according to claim 4, characterized in that the noble metal comprises silver or gold.

7. An electronic component according to claim 6, characterized in that the base metal comprises copper, nickel, cobalt, tungsten or manganese.

8. An electronic component according to claim 7, characterized in that the noble metal is silver and the base metal is copper or nickel.

9. An electronic component according to claim 4, characterized in that the calcined electrode is disposed in a through-hole or a via-hole.

10. An electronic component according to claim 1, characterized in that the member of the group is anti-oxidation finished base metal.

11. An electronic component according to claim 10, characterized in that the dimensional retention of the calcined electrode is not lower than 0.85.

12. An electronic component according to claim 10, characterized in that the calcined electrode is disposed in a through-hole or a via-hole.

13. Manufacturing method of the electronic component of claim 1, comprising the steps of
   a) preparing a conductive powder mixture consisting essentially of base metal powder and another metal selected from the group consisting of noble metal, anti-oxidation finished base metal and aluminum, wherein the base metal undergoes oxidative expansion on calcination and is present in such an amount that the dimensional retention of the calcined electrode on calcination is not lower than about 0.6, and wherein the dimensional retention is the ratio of the electrode thickness after calcination to the dry thickness before calcination, and
   b) calcining the conductive powder mixture to obtain the calcined electrode.

14. A manufacturing method according to claim 13, characterized in that amount of base metal is such that the dimensional retention of the calcined electrode is not lower than about 0.85.

15. A manufacturing method according to claim 13, characterized in that the member of the group is anti-oxidation finished base metal.

16. A manufacturing method according to claim 13, wherein the conductive powder mixture contains glass frit and the calcining is performed at 850° C.

17. A manufacturing method according to claim 13, wherein the member of the group is noble metal.

18. A manufacturing method according to claim 17, characterized in that amount of base metal is such that the dimensional retention of the calcined electrode is not lower than about 0.85.

19. A manufacturing method according to claim 18, characterized in that the noble metal comprises silver or gold.

20. A manufacturing method according to claim 19, characterized in that the base metal comprises copper, nickel, cobalt, tungsten or manganese.

21. A manufacturing method according to claim 20, characterized in that the noble metal is silver and the base metal is copper or nickel.

22. A manufacturing method according to claim 21, characterized in that the calcined electrode is disposed in a through-hole or a via-hole.

* * * * *